March 9, 1965 H. GESCH 3,173,068

HOLDER FOR SEMI-CONDUCTOR DIODES

Filed June 11, 1962 2 Sheets-Sheet 1

INVENTOR
HEINZ GESCH

BY
Frank R. Jrifari
AGENT

INVENTOR
HEINZ GESCH
BY
AGENT

United States Patent Office 3,173,068
Patented Mar. 9, 1965

3,173,068
HOLDER FOR SEMI-CONDUCTOR DIODES
Heinz Gesch, Hamburg, Germany, assignor to North American Philips Company, Inc., New York, N.Y., a corporation of Delaware
Filed June 11, 1962, Ser. No. 201,574
Claims priority, application Germany, July 7, 1961, P 27,495
4 Claims. (Cl. 317—234)

The invention relates to a holder for disc- or tube-shaped diodes, for example selenium and copper oxide rectifiers or germanium and silicon diodes, and for the cooling plates thereof. It relates more particularly to semi-conductor diodes for higher powers.

It is known that with semi-conductor diodes, particularly with high-power diodes, the heat produced therein by the passage of current must be conducted away, since in the event of an excessively high temperature of the semi-conductor material the activity of the diodes is reduced or the diode may even be destroyed.

It is furthermore known to arrange high-power semi-conductor diodes in an envelope which is mainly made from a metallic substance. This envelope is provided, as is known, with cooling bodies of any shape. It is also known to construct the envelope so that the diode can be fastened to a cooling plate or to a thermally conductive chassis by means of a bolt provided on the envelope.

With a different kind of envelope of semi-conductor diodes this envelope is formed by a tube, for example of ceramic material, in the interior of which the semi-conductor diode is arranged and to the two ends of which a metal cap is provided, these metal caps closing the tube hermetically and thus protecting the semi-conductor device from influences of the ambience and serving at the same time as current supplies.

Semi-conductor diodes having an envelope of such a shape cannot be screwed to a cooling surface or a chassis without the need for further means. Moreover, it is a circuitous operation to provide cooling surfaces or cooling bodies, particularly if a plurality of diodes of the kind set forth are to be stacked, for example in order to obtain a higher blocking voltage for a rectifier with semi-conductor diodes.

Similar difficulties are involved in disc-shaped selenium or copperoxide rectifiers.

It is known to arrange side by side diodes in a trough-shaped holder, the contacts of the diodes being accessible from the open side of the trough. This holder has the disadvantage that the trough with the diodes arranged therein cannot be employed in any position, unless measures are taken to prevent the diodes from falling out of the trough, so that the structure of the trough must be complicated. Moreover, the provision of cooling surfaces is complicated. There is furthermore known a holder for diodes consisting of a tube, which is cut in the longitudinal direction and which is therefore composed of two halves, in one of which there is provided, in the axial direction, a slot extending almost up to the ends, through which slot the contacts of the diodes arranged in the tube project to the outside. This holder has the disadvantages that there must be provided additional means for holding the two parts of the tube together and that owing to the slot in the longitudinal direction of one tube part such a holder cannot be shortened, if desired, by simply sawing of a part, since in this case the slot would extend to the end of the tube part and the mechanical resistance would be drastically reduced. It is finally known to provide cooling plates on a tubular body in which diodes are stacked. This arrangement has the disadvantage that the cooling plates are separated from the diodes by the tube wall, so that the transmission of the heat developed in the diodes is reduced.

These disadvantages are avoided by using a simple holder, which may be employed for versatile purposes and which serves for disc-shaped or tubular diodes, for example selenium and copper oxide rectifiers or germanium and silicon diodes, particularly semi-conductor diodes of higher power, the envelope of which consists of a tubular piece, the ends of which are provided with each one metal cap serving for the current supply and consisting of a tubular body accommodating the diodes and having slots for accommodating tags provided at each cooling plate, which are in good thermal contact with the diodes, while in the case of semi-conductor diodes having metal caps are preferably in good thermal contact with these metal caps.

It is particularly advantageous to choose the length of the tubular body so that it can accommodate a plurality of diodes. This tubular body may, for example, have lengths of one metre, from which according to need parts capable of accommodating the desired number of diodes can be severed. The distance between the slots is preferably such that it substantially corresponds to the length of the diodes. Thus it is, for example, not necessary to provide spacers in the tubular body, such as in case the diodes are shorter than the distance between the slots.

It is particularly efficaceous to use an embodiment of the holder according to the invention in which a pair of slots is provided in each plane at right angles to the axis of the tubular body, the two slots of the pair being provided on opposite sides of the body. The tag provided at the cooling plate can thus be inserted into the two slots of such a pair and the part of the tag projecting beyond the tubular body may be bent over or twisted. Thus the cooling plates are fastened in a simple manner to the tubular body. It is efficaceous to employ, with a holder according to the invention, the cooling plates for the current supply to the caps of the semi-conductor diodes. The contact between the diodes and the tags of the cooling plates may be brought about by one or more springs provided in the tubular body.

Two embodiments of a holder according to the invention will be described hereinafter with reference to the drawing.

Figure 1:
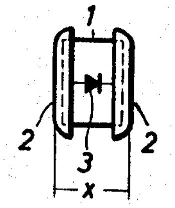
FIG. 1 shows diagrammatically a semi-conductor diode in the form of a tubular piece with metal caps applied thereto.

FIG. 1 shows a known semi-conductor diode, the envelope of which consists of a ceramic tube 1 and metal caps 2, mounted thereon and serving for the current supply to the semi-conductor device proper in the interior of the tube. This semi-conductor device is designated by the rectifier symbol 3.

Figure 2:
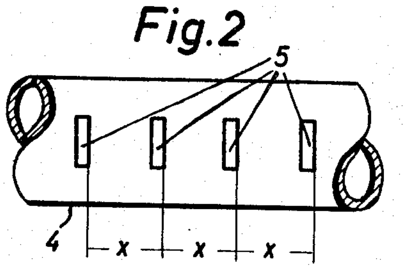
FIG. 2 shows a part of a tubular body according to the invention in a side elevation.

The holder shown in FIG. 2 consists of a tube 4 of electrically non-conductive material. This tube 4 has slots 5, provided at equal distances from each other. The distances *x* substantially correspond to the length *x* of a semi-conductor diode (FIG. 1). The tube 4 may be manufactured with a fairly great length, from which shorter parts with the required number of slots for the rectifying circuit to be held can be severed according to need.

Figure 3:
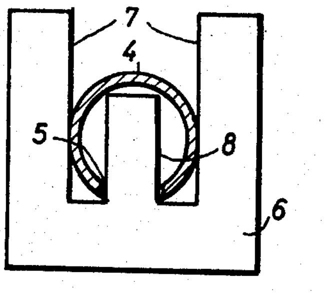
FIG. 3 shows a cooling plate mounted on a tube according to the invention.
Figure 4:
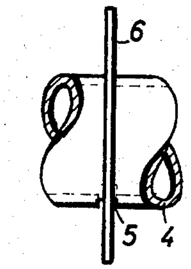
FIG. 4 shows the same in a side elevation.

The shape of the cooling plate, as is shown in FIGS. 3 and 4, is mainly determined by the recess 7, in which fits the tube 4 and by the tag 8 of the cooling plate 6, inserted through one of the slots 5 into the interior of the tube 4. Otherwise the shape of the cooling plate 6 plays only a part in that the size should be adequately large for conducting away to the surroundings the heat developed in the semi-conductor diode.

Figure 5:
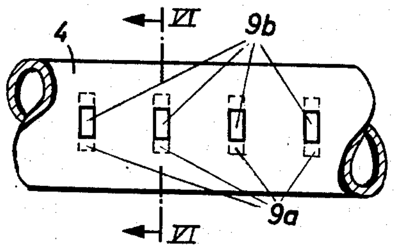
FIG. 5 shows a further embodiment of a tubular body according to the invention with pairs of slots in a side elevation.
Figure 6:
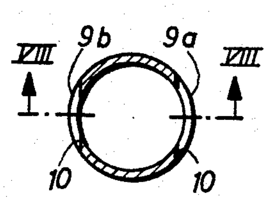
FIG. 6 is a sectional view taken on the line VI—VI in FIG. 5.
Figure 7:
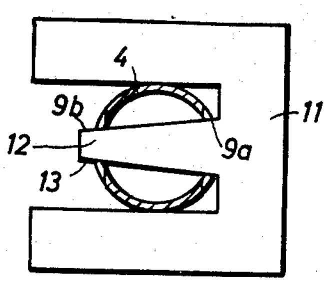
FIG. 7 shows a further embodiment of a cooling plate according to the invention.

A further embodiment of the tube 4 is shown in FIGS. 5 and 6, in which pairs of slots 9*a* and 9*b* are provided, each comprising one longer slot 9*a* and one shorter slot 9*b*. These pairs of slots can be provided in a simple manner by sawing the tube 4, so that slot faces 10 are formed (FIG. 6). The shape of the cooling plate corresponding to the embodiment of the tube shown in FIGS. 5 and 6 is shown in FIG. 7, where the cooling plate 11 is provided with a tag 12, the length of which exceeds the diameter of the tube and which can be taken through the two slots 9*a* and 9*b* of the tube 4 owing to the decreasing width as is shown in FIG. 7. By bending over or by twisting the extremity 13 of the tag 12 the cooling plate 11 is held in the tube 4.

Figure 8:
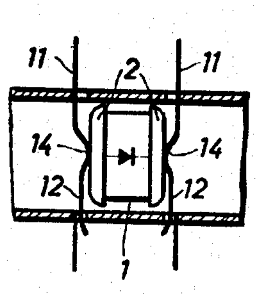
FIG. 8 is a sectional view taken on the line VIII—VIII in FIG. 6 of the tubular body with inserted diodes and cooling plates and FIG. 9 shows a holder according to the invention with four semi-conductor diodes in Graetz connection, partly in a sectional view.

FIG. 8 shows a semi-conductor diode with the ceramic envelope 1 and the two metal caps 2, between which resilient tags 12 of the cooling plates 11 are held, these tags having a bend 14 (FIG. 7). These two cooling plates 11 serve at the same time for the current supply to the semi-conductor diode.

Figure 9:
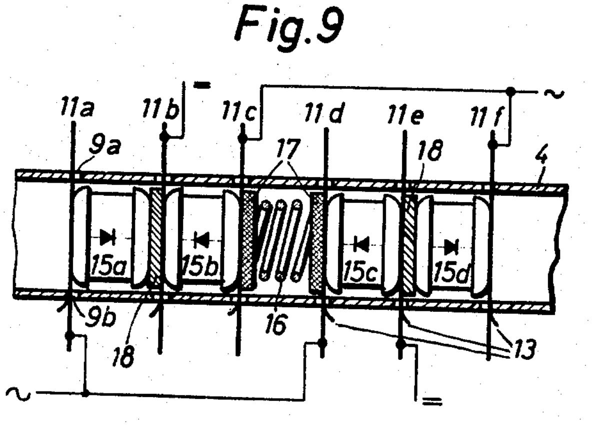

The holder according to the invention is particularly suitable for manufacturing any rectifying arrangements with the same holder parts. FIG. 9 shows the arrangement of a Graetz circuit. Four semi-conductor diodes 15*a* to 15*d*, the pass direction of which is indicated by the given rectifier symbols, are arranged between the six cooling plates 11*a* to 11*f*, the tags 12 of which are bent over at 13 in order to hold the cooling plates in the slots 9*a* and 9*b* of the tube 4. A helical spring 16 urges the cooling plate 11*c* towards the cooling plate 11*a*, which is held at the edges of the slots 9*a* and 9*b*. Thus the semi-conductor diodes 15*a* and 15*b*, arranged between the cooling plates 11*a* and 11*c* engage the tags of the cooling plates 11*a* to 11*c* with a strong pressure. This also applies to the cooling plates 11*d* to 11*f*. Electrically conductive, disc-shaped spacers 18 ensure that the cooling plates 11*b* and 11*c* or 11*d* and 11*e* respectively do not engage the edges of the slots through which they are taken. Without these spacers 18 this contact would be unavoidable, since the distance *x* between the slots 9*a* and 9*b* corresponds to the length *x* of the semi-conductor diode. Thus the whole spring force can produce the pressure of the caps 2 of the semi-conductor diodes on the tags 12 of the cooling plates 11*a* to 11*f*. The helical spring 16 is electrically insulated by two insulating discs 17 from the cooling plates 11*c* and 11*d* in order to avoid an electrical short-circuit between the helical spring 16 and the two cooling plates.

When the two terminals of an alternating voltage source are connected, as is shown in FIG. 9, to the plates 11*a*, 11*c*, 11*d* and 11*f*, which serve for the current supply to the caps of the semi-conductor diodes, a direct voltage may be derived, as is known, from the plates 11*b* and 11*e*.

In a manner similar to that shown in FIG. 9 the holder according to the invention permits of arranging switching diodes one after the other or Graetz circuits of groups of semi-conductor diodes connected in a sequence. The use of the holder is not restricted to semi-conductor diodes of the shape shown in FIG. 1; it will be obvious that use may be made of rectifying elements of a different shape, for example a rectangular section or flat rectifying elements, in which the length *x* (FIG. 1) is much smaller than the diameter. In the case of a rectangular section of the rectifying elements a rectangular section could also be chosen for the tube. The current supply to the semi-conductor diodes may furthermore be brought about in a manner differing from that using the metal caps providing the cooling effect.

The advantage of the holder according to the invention consists inter alia in the simple manufacture and the versatile usability.

What is claimed is:

1. A semi-conductor device assembly accommodating a plurality of generally disc-shaped semi-conductor diodes, comprising a single tubular body having a longitudinal axis and containing plural, longitudinally equally-spaced apertures along a wall portion thereof, plural semi-conductor diodes each having terminals at opposite ends spaced apart by a length approximately corresponding to the longitudinal aperture spacing, said diodes being disposed within the tubular body in such manner that their terminals are generally aligned with the longitudinal axis of the tubular body and lie adjacent an aperture in the wall of the tubular body, a plurality of radially-extending heat-dissipating cooling members, said cooling members each comprising a generally E-shaped, plate-like heat-conductive member having end legs and a center leg projection of a size adapted to fit within an aperture in and extend within the tubular body, said cooling members being mounted on the outside of the tubular body in a plane generally at right angles to the body axis and with the end legs at least partly surrounding the body and with the center projection of each engaging an aperture in the wall therein and passing into the interior of the tubular body and engaging a terminal of a semi-conductor diode and establishing a good heat-conducting relationship therewith, said cooling members holding the diodes therebetween in place within the tubular body, whereby heat generated at the semi-conductor diodes is conveyed by the projections of the cooling members directly to the outside of the tubular body.

2. An assembly as set forth in claim 1 wherein resilient means are provided within the tubular body between a pair of adjacent diodes and urge the cooling member projections against the diode terminals.

3. A semi-conductor device assembly accommodating a plurality of generally disc-shaped semi-conductor diodes, comprising a single tubular body having a longitudinal axis and containing plural, longitudinally equally-spaced apertures along opposed wall portions thereof, plural semi-conductor diodes each having terminals at opposite ends spaced apart by a length approximately corresponding to the longitudinal aperture spacing, said diodes being disposed within the tubular body in such manner that their terminals are generally aligned with the longitudinal axis of the tubular body and lie adjacent opposed apertures in the walls of the tubular body, a plurality of radially-extending heat-dissipating cooling members, said cooling members each comprising an E-shaped, plate-like heat-conductive member with the end legs of the E being spaced apart a distance approximately equal to the diameter of the tubular body and with a center leg projection of a size adapted to fit within opposed apertures in the tubular body and of a length exceeding the diameter of the tubular body, said cooling members being mounted on the outside of the tubular body with the end legs surrounding the tubular body and with the center projection of each engaging an aperture in the wall therein and passing into the interior of the tubular body and directly engaging a terminal of a semi-conductor diode and establishing a good heat-conducting relationship therewith and from thence passing through the opposed aperture in the opposite wall, said cooling members holding the diodes therebetween in place within the tubular body, whereby heat generated at the semi-conductor diodes is conveyed by the projections of the cooling members directly to the outside of the tubular body.

4. An assembly as set forth in claim 3 wherein the end of the projection passing through the opposed aperture is deformed to lock the cooling member on the tubular body.

References Cited in the file of this patent

UNITED STATES PATENTS

| | | |
|---|---|---|
| 2,042,542 | Masnou | June 2, 1936 |
| 2,684,457 | Lingel | July 20, 1954 |
| 2,781,480 | Mueller | Feb. 12, 1957 |
| 2,786,167 | Esseling | Mar. 19, 1957 |
| 2,799,815 | Lockett | July 16, 1957 |
| 2,897,420 | Butt | July 28, 1959 |
| 2,999,963 | Schneider | Sept. 12, 1961 |

FOREIGN PATENTS

| | | |
|---|---|---|
| 852,937 | Great Britain | Nov. 2, 1960 |
| 1,029,096 | Germany | Apr. 30, 1958 |